(12) United States Patent
Brintzinger

(10) Patent No.: US 6,943,101 B2
(45) Date of Patent: Sep. 13, 2005

(54) MANUFACTURING OF A CORROSION PROTECTED INTERCONNECT ON A SUBSTRATE

(75) Inventor: Axel Brintzinger, Dresden (DE)

(73) Assignee: Infineon Technologies AG, Munich (DE)

( * ) Notice: Subject to any disclaimer, the term of this patent is extended or adjusted under 35 U.S.C. 154(b) by 108 days.

(21) Appl. No.: 10/302,725

(22) Filed: Nov. 22, 2002

(65) Prior Publication Data

US 2003/0127743 A1 Jul. 10, 2003

(30) Foreign Application Priority Data

Nov. 30, 2001 (DE) .......................................... 101 58 809

(51) Int. Cl.[7] ...................... H01L 21/44; H01L 21/4763
(52) U.S. Cl. ....................... 438/613; 438/627; 438/628; 438/643; 438/653; 438/675; 438/687
(58) Field of Search ................................ 438/612, 613, 438/627, 628, 643, 644, 653, 654, 675, 683, 685, 687; 257/737, 751, 753, 761, 762, 763, 766, 774, 779

(56) References Cited

U.S. PATENT DOCUMENTS 5,071,518 A * 12/1991 Pan ............................ 205/122
6,403,457 B2 * 6/2002 Tandy ......................... 438/613
2001/0040290 A1  11/2001 Sakurai et al. ............... 257/737

FOREIGN PATENT DOCUMENTS

DE   4235919 A1   10/1992   ........... H01L/21/90
EP   1003209 A1   5/2000    ......... H01L/21/288

OTHER PUBLICATIONS

Baker et al., "Immersion Gold as a Sensitizer for Electroless Gold Plating", IBM Technical Disclosure Bulletin, vol. 15, No. 4, Sep. 1972.

* cited by examiner

Primary Examiner—Hung Vu
(74) Attorney, Agent, or Firm—Fish & Richardson P.C.

(57) ABSTRACT

A method for fabricating an interconnect on a surface of a passivated substrate includes applying a diffusion barrier to the surface of the passivated substrate and applying a mask to the diffusion barrier. The mask is then patterned to provide an opening for the interconnect. The interconnect is deposited in the opening and the mask is removed. Those portions of the diffusion barrier that are not covered by the interconnect are also removed. The interconnect and what is left of the diffusion barrier are then encapsulated by metal-selective wet-chemical dip coating.

23 Claims, 3 Drawing Sheets

MANUFACTURING OF A CORROSION PROTECTED INTERCONNECT ON A SUBSTRATE

FIELD OF INVENTION

The present invention relates to a fabrication method for an interconnect on a semiconductor substrate and a corresponding interconnect.

RELATED APPLICATIONS

This application claims the benefit of the priority date of German application 10158809.7 filed on Nov. 30, 2001, the contents of which are herein incorporated by reference.

BACKGROUND

With the advent of the technology of wafer level packaging (WLP), wafer level test (WLT) and wafer level burn-in (WLBI), it has become necessary to equip semiconductor substrates or semiconductor chips with electrically connecting elements which have a built-in compliance (flexibility) in the direction of the X, Y and Z axes.

A further requirement is that it is necessary to provide a stable electrical connection from the semiconductor chip to the printed circuit board. In the case of a copper interconnect, the metal must be protected against oxidation and corrosion. This is usually realized by encapsulating the copper with another, more resistant metal such as e.g. gold.

A disadvantage of such protection is that an additional photolithographic stage has hitherto been required in fabrication. This makes the process more costly and more complex.

FIG. 6 shows the cross section of a semiconductor substrate 1 provided with an interconnect according to a customary method. A layer 2 made of a titanium compound, which serves as a diffusion barrier for all subsequent coating steps, is applied to the substrate 1 by the sputtering method. Above it, it is adjoined by a copper carrier layer 3, which is applied by the sputtering method and is required in order, as short-circuit layer, to enable a subsequent electrophoretic coating with a copper interconnect 4, and as diffusion barrier. A photolithographically patterned mask 7 made of photoresist that can be electrodeposited determines the width of the interconnect 4. A nickel layer 5 is applied above the copper interconnect 4. Above the nickel layer, the latter is adjoined by a gold layer 6, which is required for wetting with solder since adequate wetting of the surface with solder does not take place on nickel. The nickel layer 5 serves as a diffusion barrier between the copper layer 4 and the gold layer 6, since the gold would otherwise diffuse completely into the copper.

FIG. 7 shows the arrangement after the removal of the mask 7 made of the photoresist that can be electrodeposited. The sidewalls 8 of the copper interconnect 4 are uncovered and thus exposed to corrosion.

FIG. 8 shows the arrangement after the structure etching of the copper carrier layer 3 and the layer 2 made of the titanium compound. The sidewalls 8 of the copper interconnect 4 and of the copper carrier layer 3 are uncovered and can corrode. An undercut 11 can impair the adhesion of this interconnect arrangement on the substrate 1.

In the case of the non-compliant (-flexible) wafer level packages (WLP) (e.g. flip-chip), a corrosion protection for the copper constituents of this interconnect arrangement can be applied by reliquefying solder which is applied to the metal interconnect arrangement from above (underbump metallurgy UBM). This reliquefaction allows the solder (SnPb) to flow over the edges of the copper and to encapsulate the copper in the process. Other methods utilize a further photolithographic step and encapsulate the metal either with a dielectric, such as e.g. benzocyclobutene (BCB), or other corrosion-resistant materials.

In the case of the compliant (flexible) wafer level packages (WLP), no encapsulation method has been disclosed heretofore.

Reliquefying the solder in order thereby to encapsulate the copper requires a high outlay and is very cost-intensive. This is also technically infeasible in the case of compliant electrical connecting elements because the entire interconnect would have to be covered with solder in this case. The use of an additional photolithographic step in order to ensure encapsulation of the metal is likewise associated with a high outlay and high costs.

SUMMARY

It is an object of the present invention to provide a simple fabrication method for an interconnect on a substrate which can ensure a corrosion protection of corrodible materials, such as e.g. copper, in particular also in the field of wafer level packaging (WLP), and to provide a corresponding corrosion-protected interconnect.

The idea on which the present invention is based consists in processing an interconnect arrangement that has already been applied and patterned, so that a subsequent deposition process (electroless coating) can encapsulate the interconnect arrangement.

In the present invention, the problem mentioned in the introduction is solved in particular by virtue of the fact that corrodible layers, for example made of copper, are encapsulated by a non-corrodible material, in particular a corrosion-resistant metal, without this requiring an additional photolithographic step. After the removal of the photoresist structure and the carrier and diffusion layers, electroless coating is effected with a material which is corrosion-resistant and is permitted to enclose the underlying layers. Consequently, only one photolithographic step is required.

In accordance with one preferred embodiment, the interconnect is encapsulated in a wet-chemical method, in particular a dip coating process, in which atoms and/or molecules of a less corrodible material, in particular a metal such as gold, are added or deposited on the already applied metal layers wetted with a solution, in particular without an electrical potential being applied.

In accordance with one preferred development, the photoresist is deposited by an electrochemical deposition process.

In accordance with a further preferred development, undercuts that occur in the fabrication method are at least partly reduced or virtually compensated for during the electroless coating, in particular during a dip coating.

Exemplary embodiments of the invention are illustrated in the drawings and are explained in more detail in the description below.

BRIEF DESCRIPTION OF THE FIGURES

In the figures, identical reference symbols designate identical or functionally identical constituent parts.

DETAILED DESCRIPTION

Figure 1:
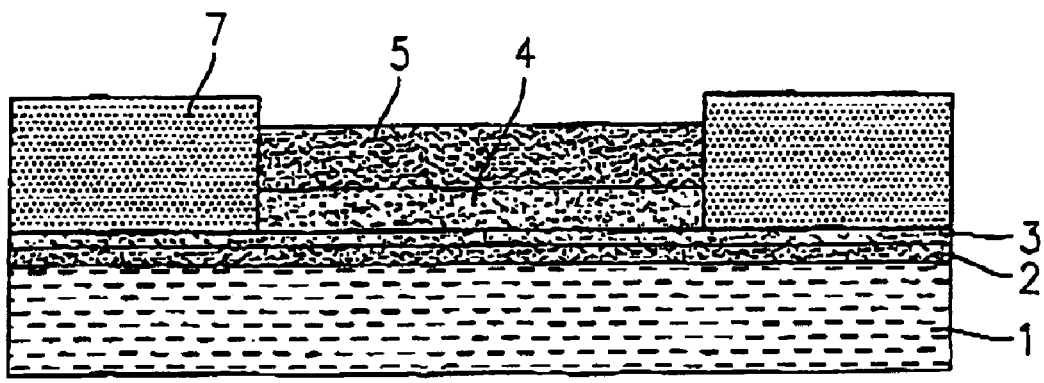
FIG. 1 shows the cross section of an arrangement for elucidating an embodiment of the invention after elementary steps in the fabrication process.

FIG. 1 shows the cross section of an arrangement for elucidating an embodiment of the present invention. In conjunction with the subsequent FIGS. 2 to 5, FIG. 1 represents a starting point in the fabrication method in accordance with the present embodiment.

In accordance with FIG. 1, a titanium compound (Ti/TiN or Ti/TiW) in a layer 2 has been sputtered onto a passivated semiconductor substrate 1. The semiconductor substrate 1 is passivated by means of an electrically insulating oxide or dielectric. The layer 2 made of the titanium compound serves as a diffusion barrier. After the application of the layer 2 made of the titanium compound, a copper carrier layer 3 is likewise applied by the sputtering method. The copper carrier layer 3 serves as a short-circuit layer and is required in order to enable a subsequent electrical, electrolytic copper coating. A photoresist layer 7 applied in an electrical deposition process has been patterned in a photolithographic process and serves as mask resist for the copper coating 4. The copper coating thus produces an interconnect 4 which has the width of the mask opening.

Figure 2:
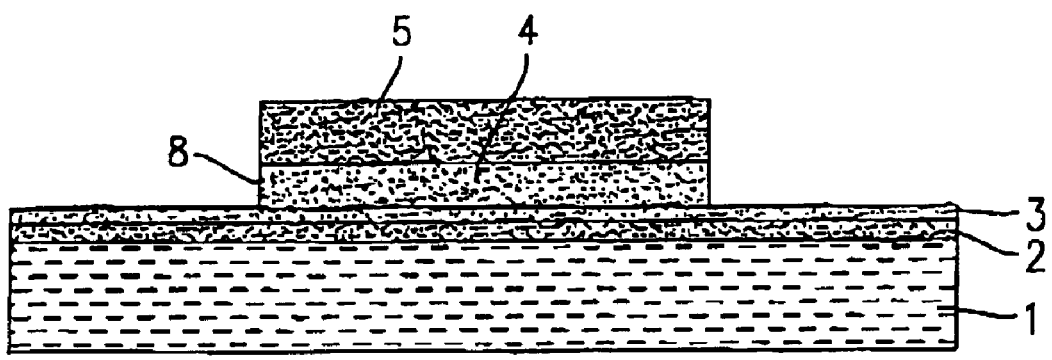
FIG. 2 shows the cross section of the arrangement after the method stage of removing the mask made of photoresist.

FIG. 2 shows the cross section of the arrangement after an etching process of the photoresist of the mask 7. To that end, the electrophoretic photoresist (resist) is brought into contact with sodium hydroxide solution (NaOH), which is also referred to as a stripper for removing the mask.

Figure 3:
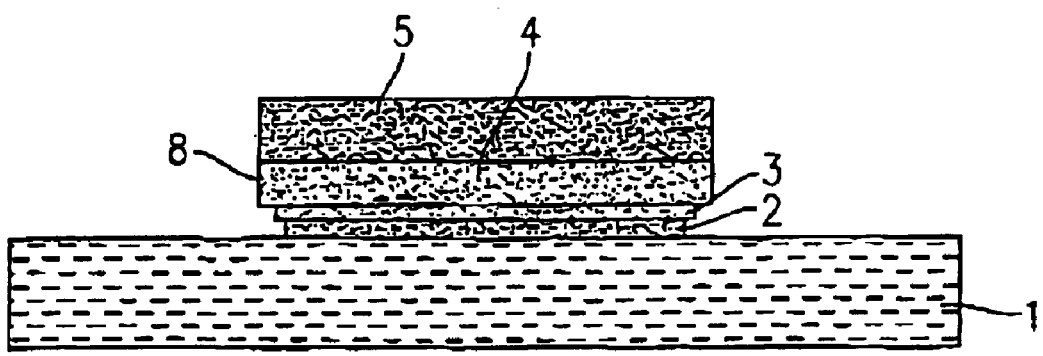
FIG. 3 shows the cross section of the arrangement after the method step of diffusion barrier and carrier layer etching.

FIG. 3 illustrates the cross section of the arrangement after two further etching processes, during which firstly the uncovered copper carrier layer 3 is removed. Not only the copper carrier layer 3, as desired for the patterning, but also the overlying copper coating 4 is attacked in this etching process. However, since the thickness of the copper carrier layer 3, with 150 nm, for example, is at least one order of magnitude smaller than the dimensions of the copper coating 4, which has a width of 50 $\mu$m and thickness of 2 $\mu$m, for example, the reduction of the layer width and thickness of the copper coating 4 can be accepted as tenable. A slight undercut 11 of the interconnect arrangement occurs during this step.

The second etching process removes the layer 2 made of a titanium compound, serving as short-circuit layer or diffusion barrier, in uncovered regions in conjunction with an additional, more pronounced undercut 11.

Figure 4:
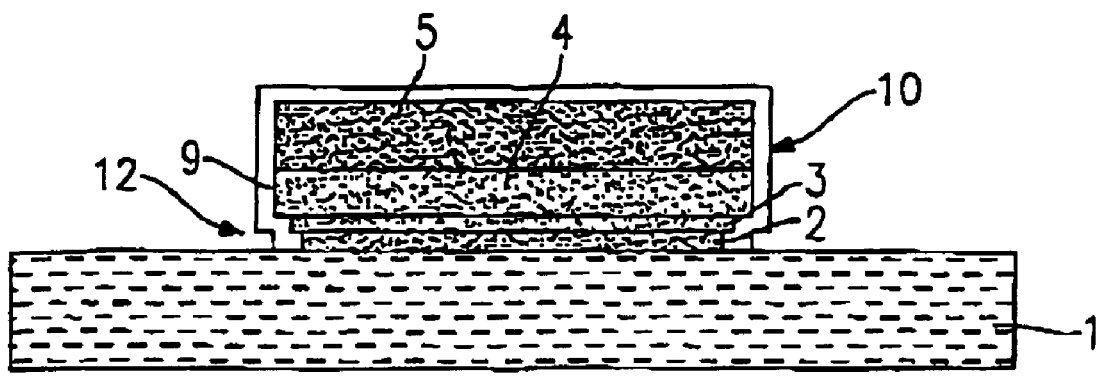
FIG. 4 shows the cross section of the arrangement after a first electroless coating step.

FIG. 4 shows the cross section of the arrangement after an electroless coating with a material such as e.g. nickel 9, which encapsulates the layers made of corrodible copper 3, 4 and also the layer 2 made of a titanium compound. The electroless coating with the thin nickel layer 9 is effected in a wet-chemical dipping process, in particular without an applied potential. In this process, atoms or molecules are replaced or added on metallic surfaces of the arrangement which are wetted with solution. Consequently, the undercut 11 is also at least partly reduced and an enclosing corrosion protection 10 is provided around the corrodible metals. By contrast, no nickel is deposited on the non-metallized substrate. Undercuts 11 that occur in the preceding fabrication process are at least partly reduced or compensated for by the electroless coating process, as illustrated by 12.

Figure 5:
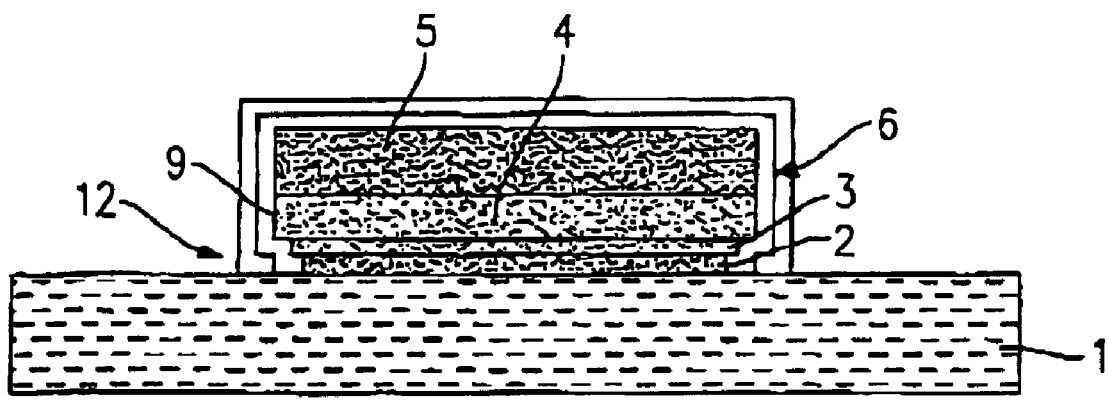
FIG. 5 shows the cross section of the arrangement after a concluding electroless coating step.
Figure 6:
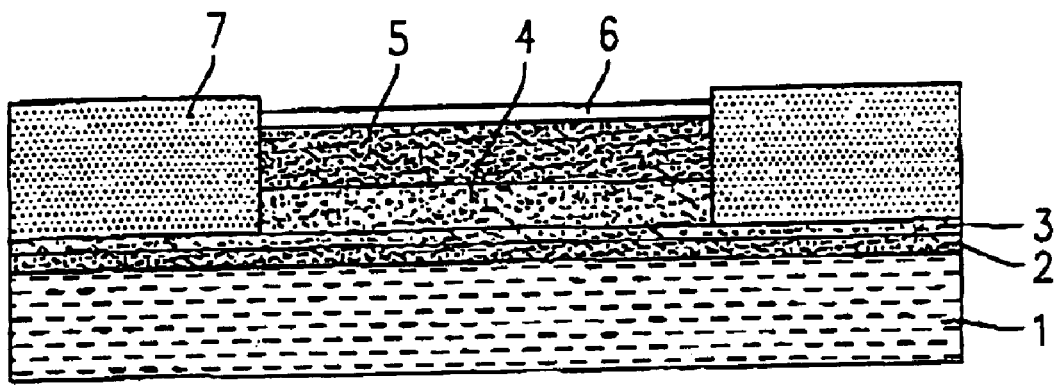
FIG. 6 shows the cross section of a customary arrangement for elucidating a customary method after elementary steps in the fabrication method.
Figure 7:
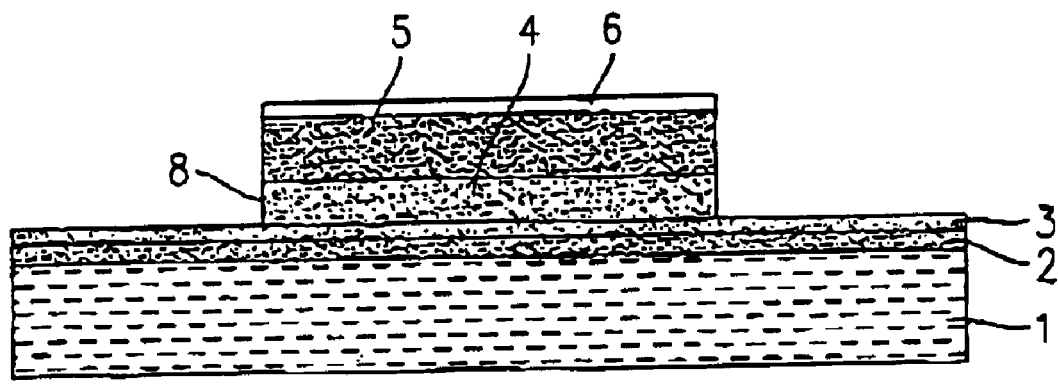
FIG. 7 shows the cross section of the customary arrangement after the method step of removing the mask made of photoresist.
Figure 8:
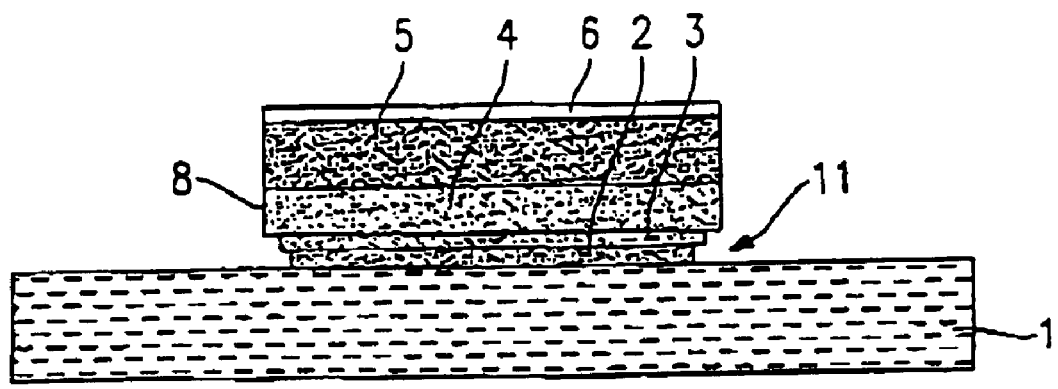
FIG. 8 shows the cross section of the customary arrangement after two further etching processes in the fabrication method.

FIG. 5 shows a cross section of the arrangement after the electroless application of a gold layer 6 to the structure in accordance with FIG. 4. This gold layer 6 is required in order later to enable a wetting with solder (e.g. SnPb), since such a wetting with solder is not ensured satisfactorily on nickel. The corrosion-resistant gold layer 6 must be separated from the copper coating 4 by the nickel layer 5,9, which serves as a diffusion barrier, since the gold coating 6 would otherwise diffuse completely into the copper layer 4 and the copper carrier layer 3 and, consequently, the desired corrosion protection would not be ensured. A reduced undercut 12 results from the additional, electrolessly applied gold layer 6.

Although the present invention has been described above using a preferred exemplary embodiment, it is not restricted thereto, but rather can be modified in diverse ways. In particular, it is possible, of course, to use other layer materials or to provide additional interconnect layers. Moreover, the invention is not restricted to the application possibilities mentioned. Other embodiments are within the scope of the following claims.

What is claimed is:

1. A method for fabricating an interconnect on a surface of a passivated substrate, the method comprising:

applying a diffusion barrier to the surface of the passivated substrate;

applying a mask to the diffusion barrier;

patterning the mask to provide an opening for the interconnect;

depositing the interconnect in the opening;

removing the mask;

removing the diffusion barrier from portions of the surface that are not covered by the interconnect;

encapsulating the interconnect and a remaining portion of the diffusion barrier by electroless deposition; and applying a further encapsulation layer to the encapsulation layer by metal-selective non-electrolytic wet-chemical dip coating.

2. The method of claim 1, further comprising including a metal layer in the diffusion barrier.

3. The method of claim 1, further comprising including titanium in the diffusion barrier.

4. The method of claim 1, further comprising applying a carrier layer to the diffusion barrier before applying the mask.

5. The method of claim 4, wherein applying the further encapsulation layer partially compensates for an undercut that forms in the carrier layer during encapsulation of the interconnect.

6. The method of claim 4, further comprising etching away the carrier layer after removing the mask.

7. The method of claim 4, further comprising including a corrodible metal in the carrier layer.

8. The method of claim 7, further comprising including copper in the corrodible metal.

9. The method of claim 1, further comprising including a corrodible metal in the interconnect.

10. The method of claim 1, further comprising including copper in the interconnect.

11. The method of claim 1, wherein applying a mask to the diffusion barrier comprises using an electrical deposition process to apply the mask.

12. The method of claim 1, wherein patterning the mask comprises patterning the mask using a photolithographic process.

13. The method of claim 1, wherein applying a further coating comprises applying a coating that includes a metallic material.

14. The method of claim 1, wherein applying a further encapsulation layer comprises applying a coating that includes nickel.

15. The method of claim 1, wherein encapsulating the interconnect comprises performing a metal-selective non-electrolytic wet-chemical dip coating.

16. The method of claim 1, wherein encapsulating the interconnect comprises depositing a non-corrodible material thereon.

17. The method of claim 1, wherein encapsulating the interconnect comprises depositing a metallic material thereon.

18. The method of claim 1, wherein encapsulating the interconnect comprises depositing nickel thereon.

19. The method of claim 1, wherein applying the further encapsulation layer partially compensates for an undercut that forms during encapsulation of the interconnect.

20. The method of claim 1, wherein applying the further encapsulation layer partially compensates for an undercut that forms in the diffusion barrier during encapsulation of the interconnect.

21. The method of claim 1, wherein electroless deposition is a metal-selective wet-chemical dip coating.

22. The method of claim 1, wherein applying the further layer comprises including a non-corrodible metal in the further layer.

23. The method of claim 1, wherein applying the further layer comprises including gold in the further layer.

* * * * *